US006660374B2

(12) United States Patent
Smetana et al.

(10) Patent No.: US 6,660,374 B2
(45) Date of Patent: Dec. 9, 2003

(54) RADIATION-CURABLE COMPOSITIONS AND CURED ARTICLES

(75) Inventors: David A. Smetana, North Canton, OH (US); Joseph V. Koleske, Charleston, WV (US)

(73) Assignee: Suncolor Corporation, North Canton, OH (US)

( * ) Notice: Subject to any disclaimer, the term of this patent is extended or adjusted under 35 U.S.C. 154(b) by 36 days.

(21) Appl. No.: 10/053,021

(22) Filed: Jan. 18, 2002

(65) Prior Publication Data

US 2002/0086161 A1 Jul. 4, 2002

Related U.S. Application Data

(63) Continuation of application No. 09/616,201, filed on Jul. 13, 2000, now Pat. No. 6,350,792.

(51) Int. Cl.⁷ .............................. C08F 2/48; B32B 5/00
(52) U.S. Cl. .................. 428/327; 428/325; 428/323; 428/331; 428/332; 428/333; 428/334; 428/336; 428/402; 428/404; 428/407; 428/426; 428/413
(58) Field of Search ................................ 428/426, 413, 428/323, 325, 327, 331, 332, 333, 334, 336, 402, 404, 407; 522/81, 71, 74, 77, 79, 80, 83, 100, 101, 103, 109, 110, 112, 120, 121, 122, 182, 172, 31, 25, 15, 33

(56) References Cited

U.S. PATENT DOCUMENTS

| | | |
|---|---|---|
| 2,750,395 A | 6/1956 | Phillips et al. |
| 2,890,194 A | 6/1959 | Phillips et al. |
| 3,318,822 A | 5/1967 | Balzer et al. |
| 3,379,653 A | 4/1968 | Ernst et al. |
| 3,586,616 A | 6/1971 | Kropp |
| 3,708,296 A | 1/1973 | Schlesinger |
| 4,058,400 A | 11/1977 | Crivello |
| 4,068,091 A | 1/1978 | Dol |
| 4,069,055 A | 1/1978 | Crivello |
| 4,161,478 A | 7/1979 | Crivello |
| 4,205,018 A | 5/1980 | Nagasawa et al. |
| 4,227,978 A | 10/1980 | Barton |
| 4,231,951 A | 11/1980 | Smith et al. |
| 4,256,828 A | 3/1981 | Smith |
| 4,407,984 A | 10/1983 | Ratcliffe et al. |
| 4,425,287 A | 1/1984 | Hesse et al. |
| 4,512,340 A | 4/1985 | Buck |
| 4,603,158 A | 7/1986 | Markham et al. |
| 4,683,287 A | 7/1987 | Koleske et al. |
| 4,721,734 A | 1/1988 | Gehlhaus et al. |
| 4,931,347 A | 6/1990 | Slovinsky et al. |
| 5,019,745 A | 5/1991 | Deal et al. |
| 5,252,694 A | 10/1993 | Willett et al. |
| 5,384,339 A | 1/1995 | Starkey |
| 5,453,451 A | 9/1995 | Sokol |
| 5,476,748 A | 12/1995 | Steinmann et al. |
| 5,486,384 A | 1/1996 | Bastian et al. |
| 5,516,813 A | 5/1996 | Starkey |
| 5,554,666 A | 9/1996 | Livesay |
| 5,610,108 A | 3/1997 | Watzke et al. |
| 5,667,934 A | 9/1997 | Markovich et al. |
| 5,753,722 A | 5/1998 | Itokawa et al. |
| 5,973,033 A | 10/1999 | Ober et al. |

FOREIGN PATENT DOCUMENTS

| | | |
|---|---|---|
| DE | 197 50 147 | 5/1999 |
| EP | 535 828 | 4/1993 |
| WO | WO 97/38354 | 10/1997 |

OTHER PUBLICATIONS

Database WPI—Section CH, Week 200033, Derwent Publications Ltd., London, GB; AN 2000–379273, XP002194241 & JP 2000 119373 (Toppan Printing Co, Ltd), Apr. 25, 2000, Abstract.
Cyracure Cycloaliphatic Epoxides, Cationic UV Cure, Union Carbide Corporation, pp. 19, 22, 1997.
SpaceRite S–11 & S–3 Alumina, UV Curable Coatings, Alcoa Industrial Chemicals Division, 2 pages, Sep. 1993.
Radiation Curing Improves Properties of Cellulose Lacquers by Phillip M. Cook, Modern Paint and Coatings, pp. –38, 40, 42, and 46, inasmuch as pp. 39, 41, 43, 44, and 45 are advertisements, Nov. 1990.

(List continued on next page.)

Primary Examiner—James J. Seidleck
Assistant Examiner—Sanza L. McClendon
(74) Attorney, Agent, or Firm—Renner, Otto, Boisselle & Sklar, LLP

(57) ABSTRACT

A radiation-curable composition in a liquid or solid form comprises at least one solid, non-crystalline radiation-transmissible material, dispersed in at least one cationic-curable or free-radical curable composition or mixture thereof. The solid, non-crystalline radiation-transmissible materials comprise glasses and other suitable materials that transmit (i.e., are transparent to) at least about 40% of radiation having a wavelength from about 180 to about 600 nanometers.

The cationic-curable compositions comprise at least one cycloaliphatic epoxide, at least one polyol, and at least one cation-generating photoinitiator. The free-radical curable compositions comprise at least one ethylenically unsaturated compound and at least one free-radical-generating photoinitiator unless electron beam curing is used, in which case the amount of photoinitiator can be reduced or even eliminated.

The solid forms of the radiation-curable compositions of the invention are useful as powder coatings for coating decorative and functional objects and that would be cured by a thermal heating flow process followed by radiation exposure. The cured compositions of the invention are useful as coatings and inks for metal, paper, plastics, glass, ceramics, and wood, as adhesives, as sealants, and as composite materials and other articles. The cured compositions of this invention also are useful in biomedical and dental applications, including prosthetic devices such as dentures; coatings, fillings, and caps for teeth; and the like.

19 Claims, No Drawings

OTHER PUBLICATIONS

New Powders Break Heat Barriers, Jane Bailey, Editor, Industrial Paint & Power, Powder Report, pp. 18–23, Dec. 1997.

UV–Curable Unsaturated Polyester Systems for the Industrial Finishing of Furniture by Dr. B.H. Riberi, Paints and Coatings Industry (PCI), pp. 72–78, Oct. 1990.

Car Coatings Go Green, Environmental issues drive product development, by Anita Shaw, Modern Paint & Coatings, Feb., 2001, pp. 13–15– www.modernpaintandcoatings.com.

Industrial Coating Advances In The Blink Of An Eye, by Dariene Brezinski, Ph.D., Paint & Coatings Industry Magazine, Feb., 2001, pp. 40–44.

Concise Chemical and Technical Dictionary, Chemical Publishing Co. Inc., p. 298, 1974.

A Novel Photoinitiator of Cationic Polymerization: Preparation and Characterization of Bis[4–(diphenylsulfonio)phenyl]sulfide–Bis–Hexafluorophosphate by Watt et al., Journal of Polymer Science, Polymer Chemistry Edition, vol. 22, pp. 1789–1796, 1984.

New Associative Thickeners an Their Use in Waterborne and High–Solids Coatings by Johan Bieleman, Paint and Coatings Industry, XV (11), p. 46–52,54,56 Nov. 1999.

Transmission of Light by Common Optical Materials, CRC Handbook of Chemistry and Physics, $76^{th}$ edition, p. 10–305, 1995–1996.

Powder Coatings by Josef H. Jilek, Federation Series on Coatings Technology, Federation of Societies for Coatings Technology, pp. 1–35, 1991.

Hawley's Condensed Chemical Dictionary, Van Nostrand Reinhold Company, $11^{th}$ edition, p. 325, 1987.

Free Radical Radiation Curing by Joseph V. Koleske, Federation Series on Coatings Technology, pp. 1–29 , Federation of Societies for Coatings Technology, 1997.

Cationic Radiation Curing by Joseph V. Koleske, Federation Series on Coatings Technology, pp. 1–27 , Federation of Societies for Coatings Technology, 1991.

A Radiation–Cure Primer by Joseph V. Koleske, J. Coatings Technology, pp. 30–38, No. 866, 1997.

RADIATION-CURABLE COMPOSITIONS AND CURED ARTICLES

CROSS-REFERENCE

This is a continuation of application Ser. No. 09/616,201, filed on Jul. 13, 2000 now U.S. Pat. No. 6,350,792, of Smetana, et al., for RADIATION-CURABLE COMPOSITIONS AND CURED ARTICLES.

FIELD OF THE INVENTION

This invention relates to radiation-curable compositions and articles comprising at least one solid, non-crystalline, radiation-transmissible material dispersed in at least one cationic-curable or free-radical curable composition.

BACKGROUND OF THE INVENTION

Radiation-curable coatings, inks, adhesives, and sealants are well known. These compositions may be cured with electron beam radiation, ultraviolet ("UV") light, visible light, gamma rays, and the like. The compositions are based on technology that invokes cure through a free-radical cure mechanism and usually involves acrylates (*Free Radical Radiation Curing,* Federation Series on Coatings Technology, 29 pp, Federation of Societies for Coatings Technology, 1997), or through a cationic cure mechanism and usually involves cycloaliphatic epoxides (*Cationic Radiation Curing,* Federation Series on Coatings Technology, 27 pp, Federation of Societies for Coatings Technology, 1991). An overview of both technologies can be found in J. Coatings Technology, "A Radiation-Cure Primer," Vol. 69, No. 866, p. 29, 1997. Such radiation-curable coatings are considered to be ecologically friendly, since they are usually substantially volatile-organic-solvent free. Furthermore, such radiation-curable coatings are typically low-energy requiring systems, since essentially 100% of the uncured system is transformed into the final coating in a very short time under a radiation source that is usually ultraviolet and visible light, an electron beam, a carbon arc, or the like. The exact nature or wavelength of the radiation energy used is dependent on the photolysis characteristics of the particular photoinitiator or photoinitiators involved.

Electron beam curing is used for compositions based on acrylates and methacrylates and that require free radicals to initiate the curing process, but electron beam curing can be used for cationic systems. Because of high equipment costs associated with electron beam systems, they are usually used for curing clear or pigmented coating formulations on large quantities of coated articles and at high cure speeds. However, recently smaller electron beams units that can be used in conjunction with conveyer belts have been introduced commercially for small-scale production processes. The high energy electrons produced by an electron beam pass easily through solid objects such as pigment particles, and the electrons' contact with certain molecules, such as those containing ethylenic unsaturation, can cause free radical formation and cure without the use of an added photoinitiator.

Photocure technology requires the addition of a compound known as a photoinitiator to the formulation. The photoinitiator photolyzes, i.e., breaks down or degrades in the presence of radiation of the proper wavelength (which can vary from the ultraviolet range through the visible range according to the photoinitiator selected) to form an active species that will initiate polymerization either directly or indirectly. While such technology is readily applicable to clear, thin compositions, there is a need for improved photocuring technology that will allow easy cure of opaque and/or colored compositions as well as clear, thick compositions at reasonable production rates. Such an improvement also should benefit both industry and the environment by eliminating the use of organic solvents and decreasing the amount of energy required for production while increasing productivity.

U.S. Pat. No. 5,453,451 relates to a substantially solvent free, liquid, sprayable coating composition including one or more acrylates and one or more photoinitiators that polymerize the composition when exposed to ultraviolet light. U.S. Pat. No. 4,721,734 relates to photoinitiator products and technology for photochemically-initiated polymerization reactions.

U.S. Pat. No. 4,425,287 relates to a process for the production of moldings from unsaturated polyester resins. A pulverulent filler is employed that transmits ultraviolet light so that curing is complete even in the deeper lying layers. Examples given of suitable fillers are aluminum oxide hydrate, glass powder, quartz powder, quartz sand, glass beads, barium sulfate, talc, and finely disperse silica. However, aluminum oxide trihydrate is crystalline, highly absorbent to components of reaction mixtures in which it is used, and has been found to produce unsatisfactory cures in the compositions of the present invention. Furthermore, glass in general is opaque to ultraviolet light. See Handbook of Chemistry and Physics, $76^{th}$ edition, 1995–1996, p. 10–305. The Handbook also notes that quartz is very transparent to both ultraviolet light and the visible spectrum. However, not all quartzes are in fact transparent to said spectrum. Furthermore, quartz is typically crystalline, which makes it not economically feasible in most applications and presents health hazards. Furthermore, quartz sand contains impurities that interfere with transmission of radiation wavelengths employed in the present invention. Barium sulfate is unsatisfactory in the compositions of the present invention because it is crystalline and has a high specific gravity (about 4.50) that renders it poorly mixable with the compositions of the present invention. Talc is unsatisfactory because it is crystalline and also tends to absorb components of reaction mixtures in which it is used. The term "finely disperse silica" does not indicate whether it is crystalline or non-crystalline, and also does not indicate its purity, transparency/opacity, index of refraction, or absorbency. Crystalline silica presents the same health hazards as crystalline quartz.

An overview of powder coating technology can be found in the December 1997 issue of *Modern Paints and Coatings,* pp. 72–78. The technology of powder coating also has been described in *Powder Coatings, Federation Series on Coatings Technology,* 35 pp., Federation of Societies for Coatings Technology, 1991.

Although many types of radiation-curable coating and ink compositions and substrates exist, most of them are clear coatings that are rapid curing, cost effective, and environmentally friendly. However, there still are problems in curing opaque and/or colored systems using photocure technology due to the difficulty in making ultraviolet and/or visible light penetrate through pigments, fillers, and similar opaque and/or colored materials, or through thick masses or films of clear compositions. It is especially difficult to achieve such penetration in economically feasible time periods of about a fraction of a second to about a few seconds. This is particularly true for 3-dimensional articles and for thick films greater than about 0.5 mil to about 3 or more mils in thickness.

There is a need for materials that, when combined with opaque and/or colored photocurable reactants, will produce compositions that can be readily cured thoroughly (i.e., deeply and uniformly) with ultraviolet and visible light. There is also a need for materials that, when combined with clear photocurable reactants, will produce compositions that can be readily cured thoroughly (i.e., deeply and uniformly) as thick films or masses. This invention provides such novel compositions.

SUMMARY OF THE INVENTION

A radiation-curable composition in a liquid or solid form comprises at least one solid, non-crystalline, radiation-transmissible material, dispersed in at least one cationic-curable or free-radical curable composition or mixture thereof. The term "transmissible" means substantially transparent to radiation as defined more fully below. The solid, non-crystalline, radiation-transmissible materials comprise certain glasses, quartzes, and other inorganic or organic solids that will not interfere with the radiation-induced polymerization by dissolution, swelling, or other mechanism, and that transmit at least about 40% of radiation having a wavelength from about 180 to about 600 nanometers.

The cationic-curable compositions comprise at least one cycloaliphatic epoxide, at least one cation-generating photoinitiator, and optionally one or more polyols, photosensitizer, acrylic monomers or oligomers, vinyl ethers, other epoxides, pigments or other colorants, fillers, solvents, surfactants, or other ingredients known to those skilled in the art of coating, ink, adhesive, and sealant formulation. The free-radical curable compositions comprise at least one ethylenically-unsaturated compound (preferably at least one acrylate) and at least one free-radical-generating photoinitiator (unless electron beam curing is used, in which case the amount of photoinitiator can be reduced or even eliminated), and optionally one or more vinyl monomers, sensitizers, pigments or other colorants, fillers, solvents, surfactants, or other ingredients known to those skilled in the art of coating, ink, adhesive, and sealant formulation.

The solid forms of the radiation-curable compositions of the invention are useful as powder coatings that can be cured by a combination of heat (such as provided by an infrared radiation source or thermal source for flow and leveling purposes) and radiation to effect crosslinking. The cured compositions of the invention are useful as coatings and inks for metal, paper, plastics, glass, ceramics, and wood, as adhesives, as sealants, as articles, and as composite materials.

DETAILED DESCRIPTION OF THE INVENTION

The radiation-curable compositions of this invention can be liquids or solids and comprise at least one solid, non-crystalline, radiation-transmissible material, dispersed in at least one cationic-curable or free-radical curable composition or mixture thereof.

The solid, non-crystalline radiation-transmissible materials transmit (i.e., are substantially transparent to) radiation readily as described more fully below. Such materials can be inorganic or organic. "Non-crystalline" refers to solids, the molecules of which are substantially not ordered in a regular crystal lattice, i.e., are substantially not arranged in a three-dimensional periodic pattern. A crystal lattice is a regular pattern of corresponding points in repetitious three-dimensional structure of a crystal.

See Hawley's Condensed Chemical Dictionary, Van Nostrand Reinhold Company, 11$_{th}$ edition, 1987, p. 325, and the Concise Chemical and Technical Dictionary, Chemical Publishing Co. Inc., 1974, p. 298. As used herein, "amorphous" and "fused" are synonymous with "non-crystalline".

Solid, non-crystalline, radiation-transmissible materials suitable for use in this invention comprise certain glasses, including borosilicates such as Corning Pyrex® 7070, potash borosilicates such as Corning 7761, soda borosilicates such as Corning 7740, uviol glasses, and the like. (Although glasses can be considered to be high viscosity liquids, they are solids as a practical matter and for the purposes of this invention.) Solid, non-crystalline, radiation-transmissible materials suitable for use in this invention also comprise certain non-crystalline quartzes, including amorphous silicas such as Corning Vycor® 7913, vitreous silicas, fused silicas such as Corning 7940, and fused quartzes. (Fused quartz is also known as quartz glass.) Mixtures of such radiation-transmissible materials can also be used. Suitable radiation-transmissible materials for use in this invention are available, for example, from MO-SCI Corporation, Rolla, Mo., including the preferred radiation-transmissible materials which include borosilicates and fused (amorphous) silicas.

The solid, non-crystalline, radiation-transmissible materials comprise glasses or other inorganic or organic solids that will not interfere with the radiation-induced polymerization by dissolution, swelling, or other mechanism and that transmit at least about 40%, preferably at least about 50%, more preferably at least about 60%, even more preferably at least about 70%, still more preferably at least about 80%, and most preferably at least about 90% of radiation having a wavelength from about 180 to about 600 nanometers, through a 1000-micron-thick polished plate of the material being tested. UV light transmission (i.e., substantial transparency) is tested using a spectrophotometer preferably having at least the accuracy of a Perkin Elmer Lambda 40 Model with integrated instrument spheres of at least about 60 microns or equivalent, as are well known in the art. Typically, UV light transmission percentages increase as the thickness of the subject material decreases. A solid, low porosity, non-crystalline radiation-transmissible material is preferred, having minimum radiation-absorbing impurities and defects. The most suitable of such materials have a refractive index (Becke Line at 589 nm, commonly known as the "sodium D line") from about 1.3 to about 2.0, and preferably from about 1.42 to about 1.6.

The solid, non-crystalline radiation-transmissible materials preferably mix well with the compositions in which they are used and should not settle out or float readily in such compositions. For this reason, the solid, non-crystalline radiation-transmissible materials preferably have a specific gravity ranging from about 0.5 to about 3.5, more preferably from about 0.75 to about 3, and still more preferably from about 1 to about 2.5. Thixotropes can be used as suspension aids in order to obtain uniform compositions as is well known to those skilled in the art.

The solid, non-crystalline, radiation-transmissible materials also preferably are substantially non-absorptive and non-reactive with respect to components of the compositions in which they are used. Absorption and reaction both tend to reduce the amount of radiation-transmissible materials available for transmission of radiation. Typically, the radiation-transmissible materials should have low porosity and not absorb said components in an amount which is more than about 0.5% of the weight of the radiation-transmissible materials.

The solid, non-crystalline, radiation-transmissible materials can be manufactured or naturally occurring, and can be ground, expanded, extruded, or otherwise shaped. Suitable shapes include rough or smooth particles, spheres, semi-spheres, rounded particles, elliptical particles, discs, fibers, or chopped fibers, and the like. The radiation transmission characteristics of the radiation-transmissible material are more important than particle shape, although smooth or rough spheres and semi-spheres are preferred. Particle sizes may vary widely but typically are from a mean particle diameter of about 0.05 micron to about 10,000 microns or more, preferably from about 0.1 micron to about 5000 microns, and most preferably from about 0.2 micron to about 1000 microns. The particles are sized by means well known to those skilled in the art. It is also well known by those skilled in the art that particles such as these will contain a distribution of particle diameters, and that diameter ranges above are for mean particle diameters.

It is preferred that the radiation-transmissible materials are non-agglomerative (i.e., do not lump or clump together) within the compositions in which they are used in order to promote uniform curing of the compositions. Furthermore, abrasion resistance is often a desirable property of compositions of this invention. The radiation-transmissible materials preferably have a Mohs hardness from about 4.5 to about 7 and contribute to said abrasion resistance. In addition, some of the fused quartz and fused silica radiation-transmissible materials are remarkably stable under atomic and radiation bombardment and are particularly useful in electron beam applications and in extreme environments such as atomic reactors, outer space, and the like.

It can be useful, though not essential, to match the refractive index of the radiation-transmissible materials as closely as possible to the refractive index of the liquid base resins of the polymeric and coatings compositions in order to optimize the transmission of radiation through the optical interface of the radiation-transmissible materials and the surrounding base resins. The refractive index of the polymeric or coatings base resins is measured prior to the addition of pigments and fillers. The radiation-transmissible materials can be treated or coated with any substance compatible with the chemistry of the compositions of this invention, provided that the radiation transmission properties are not altered deleteriously. For example, the radiation-transmissible materials can be coated with an appropriate silane for improved dispersion and coupling or bonding of the radiation-transmissible materials to coating ingredients when cured as taught herein. Appropriate surface treatments include those available from Witco, OrganoSilicones Group, Greenwich, Conn. Certain surface treatments such as polytetrafluoroethylene can diffuse radiation that is transmitted through the radiation-transmissible transmissible materials. The radiation-transmissible materials can also be dyed in color by any means, and the refractive index (Becke Line) altered by internal dyes or surface coatings, provided that the radiation transmission properties of said materials are maintained as specified herein.

The curable compositions of this invention are based on 100 parts by weight of one or more cycloaliphatic epoxides, ethylenically unsaturated compounds (said compounds usually including at least one acrylate), or mixture of said epoxides and ethylenically unsaturated compounds. Other ingredients are added to the compositions on a PHR (parts per hundred) weight basis, i.e., on a basis of parts by weight of said other ingredients per 100 parts by weight of said epoxides, ethylenically unsaturated compounds, or mixture of said epoxides and ethylenically unsaturated compounds. By way of example, the radiation-transmissible materials in the curable compositions of this invention are present at from about 2 to about 500 parts, preferably from about 5 parts to about 300 parts, and most preferably from about 7 parts to about 150 parts by weight per one hundred parts by weight of cycloaliphatic epoxides, ethylenically unsaturated compounds, or mixture of epoxides and ethylenically unsaturated compounds.

The physical properties of the radiation-transmissible (such as compressive strength, modulus, hardness, flexibility, impact resistance, abrasion resistance, toughness, and insulating resistance) may be imparted to the cured ultraviolet-curable composition, potentially improving such properties of the cured composition.

The cationic radiation-curable compositions include at least one cycloaliphatic epoxide, and preferably one or more polyfunctional cycloaliphatic epoxides. Polyfunctional cycloaliphatic epoxides, monofunctional cycloaliphatic epoxides, and mixtures thereof can be used as described more fully below. It is known to those skilled in the art that dimers, trimers, and higher oligomers of epoxides can be present in any one kind of epoxide due to reactions that may take place during the epoxide manufacturing steps of epoxidation, purification, and recovery. A number of these epoxides are well known in the art and are commercially available. Suitable cycloaliphatic epoxides for purposes of this invention are those having an average of one or more, preferably two or more, epoxy groups per molecule. The epoxy groups may be internal epoxy groups or terminal epoxy groups as exemplified by the cycloaliphatic epoxides, which are described later. Particularly desirable cycloaliphatic epoxides are the cyclohexane diepoxides, which are epoxides having at least one cyclohexane ring to which is attached at least one vicinal epoxy group. Illustrative of suitable cycloaliphatic epoxides are the following:

(a). 3,4-epoxycyclohexylmethyl-3,4-epoxycyclohexane carboxylates having the structural Formula I:

Formula I

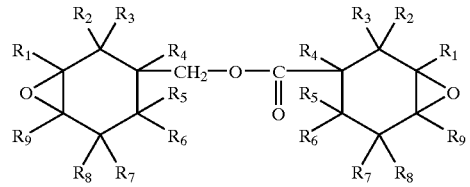

wherein $R_1$ through $R_9$ which independently are hydrogen or linear or branched alkyl radicals generally containing from one to ten carbon atoms and preferably containing from one to three carbon atoms, such as methyl, ethyl, n-propyl, isopropyl, butyl, hexyl, octyl, decyl, and the like. A particularly desirable compound is that in which $R_1$ through $R_9$ are hydrogen. Among the particular compounds that fall within the scope of Formula I are the following: 3,4-epoxycyclohexylmethyl-3,4-epoxycyclohexanecarboxylate, 3,4-epoxy-6-methyl-cyclohexylmethyl-3,4-epoxy-6-methylcyclohexanecarboxylate, 3,4-epoxy-2-methyl-cyclohexylmethyl-3,4-epoxy-2-methyl-cyclohexanecarboxylate, 3,4-epoxy-4-methyl-cyclohexylmethyl-3,4-epoxy-4-methylcyclohexanecarboxylate, and the like. Other suitable cycloaliphatic compounds are described in U.S. Pat. No. 2,890,194.

(b). Cycloaliphatic diepoxide esters of dicarboxylic acids having the following structural Formula II:

Formula II

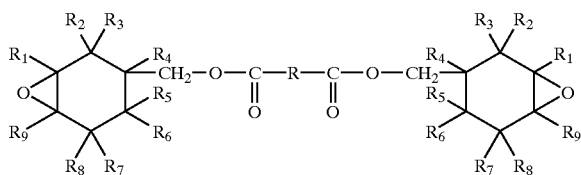

wherein $R_1$ through $R_9$ are the same as defined for structural Formula I, and R is a valence bond or a linear or branched divalent hydrocarbon radical generally containing from one to ten carbon atoms and preferably containing from 4 to 8 carbon atoms, such as alkylene radicals exemplified by trimethylene, tetramethylene, hexamethylene, 2-ethylhexylene, and the like, and cycloaliphatic radicals exemplified by 1,4-cyclohexane, 1,3-cyclohexane, 1,2-cyclohexane, and the like. Particularly desirable epoxides falling within the scope of Formula II are those wherein $R_1$ through $R_9$ are hydrogen and R is an alkylene radical containing four to six carbon atoms. Illustrative of specific compounds falling within the scope of Formula II are bis(3,4-epoxycyclohexylmethyl)adipate, bis(3,4-epoxy-6-methylcyclohexylmethyl)adipate, bis(3,4-epoxycyclohexylmethyl)oxalate, bis(3,4-epoxycyclohexylmethyl)pimelate, bis(3,4-epoxycyclohexylmethyl)sebecate, and the like. Other suitable cycloaliphatic epoxides are described in U.S. Pat. No. 2,750,395.

(c). Diepoxides having the following structural Formula III:

Formula III

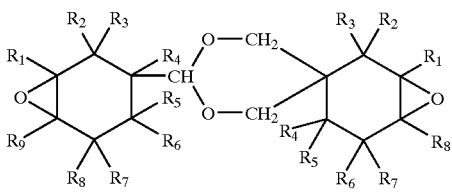

wherein $R_1$ to $R_9$ independently are hydrogen or linear or branched hydrocarbon radicals containing one to three carbon atoms. A particularly useful epoxide is one in which $R_1$ to $R_9$ are hydrogen and said compound is 2-(3,4-epoxycyclohexyl-5, 5-spiro-3,4-epoxy)cyclohexane-meta-dioxane. Further Formula III compounds are described in U.S. Pat. No. 3,318,822.

(d). Other suitable cycloaliphatic epoxides include vinyl cyclohexane diepoxide, cyclohexane diepoxide, cyclopentadiene diepoxide, limonene diepoxide, α-pinene diepoxide; trimethylolpropane mono-, di- and triglycidyl ethers; Novolac epoxides, and epoxides having either of Formulas IV and V below:

Formulas IV and V

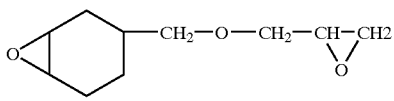

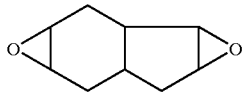

Also useful are modified cycloaliphatic epoxides such as Uvacure™ 1530, 1531, 1532, 1533, and 1534 available from UCB Chemicals. Polyfunctional epoxides provide a high degree of crosslinking and attendant solvent resistance as well as strength, adhesion and durability in coatings, inks, sealants, and adhesives.

Preferred cycloaliphatic diepoxides include one or more of (a) 3,4-epoxycyclohexylmethyl-3,4-epoxycyclohexane carboxylates having Formula I above; (b) cycloaliphatic diepoxide esters of dicarboxylic acids having the Formula II above; and (c) limonene diepoxide.

Although polyfunctional cycloaliphatic epoxides containing two or more epoxide groups are preferred, minor amounts of up to about 30% or more of monoepoxides or of blends of two or more monoepoxides based on the weight of polyfunctional epoxide can be used in the compositions of this invention. Illustrative of suitable monoepoxides are limonene monoepoxide, cc-pinene monoepoxide, 1-vinyl-3, 4-epoxycyclohexane, norbornene monoepoxide, cyclohexane monoepoxide, methylcyclohexane monoepoxide; oxetanes such as 3-ethyl-3-hydroxymethyl oxetane and the like; α-olefin epoxides such 1,2-epoxy hexane, as 1,2-epoxy decane, 1,2-epoxy dodecane, 1,2-epoxy hexadecane, and the like; 3,4-epoxy derivatives of alkoxylated and/or lactone derivatives of tetrahydrobenzyl alcohol; and the like. Preferred monoepoxides include limonene monoepoxide and 3-ethyl-3-hydroxymethyl oxetane. Monofunctional epoxides typically have low viscosity and act as reactive diluents for the formulations.

If desired, minor amounts of glycidyl epoxides may be used, such as the diglycidyl ethers of bisphenol-A, cresol-novolac epoxy resins, epoxy phenol novolac resins, diglycidyl ethers of 1,4-butanediol, alpha-olefin epoxides, and the like. Up to about 20 parts by weight of such epoxides can be added to 100 parts by weight of the cycloaliphatic epoxides used.

Various polyols and mixtures of polyols can be used in the compositions of this invention to provide flexibility and toughness to the cured compositions. The numerous polyols that can be used include polyester polyols, polycaprolactone polyols, polyether polyols, polyacrylate polyols, polyvinyl polyols, polycarbonate polyols, and the like, as well as the numerous low molecular weight or monomeric polyhydroxyl compounds that are commercially available. Illustrative of such polyols are the poly-ε-poly-caprolactone, poly-δ-valerolactone, and other polylactone polyols; the polyester polyols such as the polyester adipates and polyester oxalates which are exemplified by poly(hexanediol adipate), poly (ethylene glycol adipate), poly(diethylene glycol adipate), poly(butylene glycol adipate), poly(hexanediol oxalate), poly(ethylene glycol sebecate), and the like; poly (tetramethylene oxide); poly(propylene oxide) polyols, ethylene oxide-capped poly(propylene oxide) polyols, mixed ethylene oxide/propylene oxide-capped poly(propylene oxide) polyols, and the like; hydrogenated bisphenol A, bisphenol A, alkoxylated derivatives and lactone adducts of hydrogenated bisphenol A and bisphenol A, and the like; styrene/allyl alcohol copolymers; dimethylol dicyclopentadiene and alkoxylated versions and lactone adducts of dimethylol dicyclopentadiene; vinyl chloride/vinyl acetate/vinyl alcohol copolymers; copolymers of 2-hydroxyethylacrylate and ethyl acrylate or butyl acrylate; copolymers of hydroxypropylacrylate and butyl acrylate; glycols such as ethylene glycol, diethylene glycol, butylene glycols, hexylene glycols, and the like; triols such as trimethylolpropane; other polyhydroxyl functional materials; and the like. Preferred polyols include polycaprolactone polyols, poly(propylene oxide) polyols, poly(tetramethylene oxide) polyols, and ethylene oxide-capped poly(propylene oxide) polyols. Polyols of the above types are well known articles of commerce and widely used in the coatings, inks, adhesives, sealants, polyurethanes, and other fields.

Also illustrative of the polyols useful in the practice of this invention are the polycaprolactone diols, triols, and tetraols having a number-average molecular weight of from about 300 to about 5000, preferably from about 300 to 2000; the poly(tetramethylene oxide) diols having a number-average molecular weight of from about 650 to about 3000; the poly(propylene oxide) diols, triols, and higher functionality polyols having a number-average molecular weight of from about 200 to about 5,000 with the general following Formula VI:

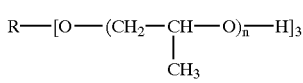

Formula VI wherein R is a linear or branched alkane of 3 to 6 carbon atoms, preferably 3 or 4 carbon atoms, n is an integer of from about 3 to about 25. These polyols include poly(oxypropylene-oxyethylene) polyols; however, desirably the oxyethylene content should comprise less than about 40 weight percent of the total and preferably less than about 25 weight percent of the total weight of the polyol. The ethylene oxide can be incorporated in any manner along the polymer chain. Stated another way, the ethylene oxide can be incorporated either in internal blocks, as terminal blocks, may be randomly distributed along the polymer chain, or may be randomly distributed in a terminal oxyethylene-oxypropylene block. Many of these polyols are well known articles of commerce. Included within this description are the reaction products of ε-caprolactone, δ-valerolactone, propylene oxide, ethylene oxide, and ethylene oxide/propylene oxide mixtures with a variety of glycols, triols, tetraols, and the like, illustrative of which are pentaerythritol, trimethylolpropane, 1,3-propanediol, 1,4-butanediol, 1,6-hexanediol, ethylene glycol, diethylene glycol, glycerol, and the like. If desired, more than one polyol can be used in a given formulation provided that the mixture of polyols is miscible.

Polyols are present at from zero to about 100, preferably from about 0.5 to about 65, and most preferably from about 3 to about 50 parts by weight per 100 parts by weight of cycloaliphatic epoxide.

Optionally, the compositions can contain minor amounts up to about 15 parts by weight per 100 parts by weight of cycloaliphatic epoxide of monohydroxyl functional compounds such as methanol, ethanol, propanol, butanol, pentanol, etc., hydroxyethyl acrylate and methacrylate, hydroxyl propyl acrylate and methacrylate, alkylene oxide derivatives of hydroxyl bearing acrylates and methacrylates, caprolactone and alkylene oxide derivatives of acrylates and methacrylates, caprolactone acrylates, and the like.

The particular polyol or mixture of polyols selected will often be related to the end use. By way of explanation of this is the fact that the polycaprolactone polyols and the poly(tetramethylene oxide) polyols are usually used in exterior applications where good weathering properties are desired, though they can be used for interior applications where weathering is of no real concern, and the poly(propylene oxide) and related poly(oxypropylene-oxyethylene) polyols are usually used for coatings that are used in interior applications, though they can be used for exterior applications if desired. Strength, flexibility, toughness, adhesion are other factors that can be affected by the selected polyol or mixture of polyols and its average molecular weight, as is known by those skilled in the art of formulation. Particularly useful polyols are the polycaprolactone diols and triols.

The photoinitiators that can be used in the cationic photocurable compositions include those that generate cations and known in the industry as the aryl iodonium salts and the aryl sulfonium salts that are usually manufactured as a complex mixture of products. These photoinitiators include, among others, one or more of the metal fluoroborates as described in U.S. Pat. No. 3,379,653; bis(perfluoroalkyl sulfonyl)methane metal salts as described in U.S. Pat. No. 3,586,616; aryl diazonium compounds as described in U.S. Pat. No. 3,708,296; aromatic onium salts of Group VIa elements as described in U.S. Pat. No. 4,058,400; aromatic onium salts of Group Va elements as described in U.S. Pat. No. 4,069,055; dicarbonyl chelates of Group IIIa-Va elements as described in U.S. Pat. No. 4,068,091; onium salts of Group VIb elements in an $MF_6$ anion where M is selected from phosphorous, antimony, arsenic as described in U.S. Pat. No. 4,161,478; arylsulfonium salts as described in U.S. Pat. No. 4,231,951; aromatic iodonium complex salts and aromatic sulfonium complex salts as described in U.S. Pat. No. 4,256,828; bis(4-(diphenylsulfonio)-phenyl)sulfide-bis-hexafluorometallic salts such as the phosphate, arsenate, and antimonate salts, and the like as described by Watt, W., et al., in J. Polymer Sci.: *Polymer Chem.* Ed., Vol. 22, page 1789 (1984); and preferably cationic photoinitiators including aryl sulfonium complex salts of Group II, V and VI elements, aromatic sulfonium or iodonium salts of halogen-containing complex ions of Group II, V and VI elements, and aromatic onium salts of Group II, V, and VI elements such as commercially available UVI-6990, UVI-6974, UVI-6976, and UVI-6992 (Union Carbide Corp.); CD1012, K185, CD1010, and CD1011 (Sartomer Co.); FX-512 (3M Co.); and KI-85 (Degussa). Especially preferred are aryl sulfonium complex salts of said elements such as aryl sulfonium hexafluorophosphate, and aryl sulfonium hexafluoroantimonate, and aromatic iodonium salts of said elements such as diaryliodonium hexafluoroantimonate. Also suitable are the ferrocenium salts such as IMACURE® 261 (CIBA Specialty Chemicals) which can be used alone or in combination with a photosensitizer such as cumene peroxide that will oxidize the salt to a stronger cationic species. The photoinitiators may be used alone, in combination with one another, or with a photoinitiator sensitizer in the photocurable compositions. It is well known by those skilled in the art that many cationic photoinitiators, for example the aryl sulfonium salts, generate free radicals in addition to cations during the photolysis process. The photoinitiators are present from about 0.03 to about 25 parts, preferably from about 0.1 to about 15 parts, and most preferably from about 0.2 to about 10 parts by weight per 100 parts by weight of cycloaliphatic epoxide. It has been found useful to pre-disperse solid photoinitiators in a small amount of epoxide prior to introduction into the formulation.

To improve both cure throughout the formulation and cure rate, a photosensitizer may be added to the photoinitiator in the photocurable composition when aryl iodonium salts such as diaryl iodonium hexafluoroantimonate (CD1012 from Sartomer Co.) are used. Through-cure or the cure from the outside of the film to the substrate is particularly difficult when pigmented and/or thick coatings or masses are involved but is achievable in this invention. Illustrative of such photosensitizers are isopropylthioxanthone, 1-chloro-4-propoxylthioxanthone, thioxanthone, xanthone, 2-sulfomethylthioxanthone, the sodium salt of 2-sulfomethylthioxanthone, 2-methoxythioxanthone, 2-methylthioxanthone, 2-hydroxythioxanthone, chlorothioxanthone, benzoflavin, acridine yellow, acridine orange, Setoflavin T, and the like. Aryl sulfonium salts can be sensitized with perylene. It has been found useful to pre-disperse the photosensitizer in a small amount of limonene dioxide or similar reactant or a solvent prior to introducing it to the formulation. It is also possible for the photosensitizers to function as photoinitiators by an energy transfer process. Preferred photosensitizers include substituted xanthone compounds such as isopropylthioxanthone and 1-chloro-4-propoxylthioxanthone. A particularly useful combination of photoinitiator and sensitizer is the diaryliodonium hexafluoroantimonate CD-1012 available from Sartomer and isopropylthioxanthone. The photosensitizers are present in an amount of from zero to about 3 parts, preferably from about 0.005 to about 2 parts, and most preferably from about 0.05 to about 1 part by weight per 100 parts by weight of cycloaliphatic epoxide.

When photolyzed, cationic photoinitiators generate both (1) cations, which cause polymerization of epoxidized cycloaliphatic esters, other epoxides, and vinyl ethers, and (2) free radicals, which can be used to polymerize acrylates or other ethylenically unsaturated polymerizable compounds such as styrene and vinyl esters. Thus the photocurable compositions optionally can contain acrylates and related compounds. The term acrylates in this document is meant to encompass both acrylates and methacrylates.

Suitable acrylates for use in the cation-curable formulations include esters of acrylic and methacrylic acid having the general structural Formula VII:

$$CH_2=C(R)-C(O)-O-R' \quad \text{Formula VII}$$

wherein R is hydrogen or methyl and R' is hydrogen; a linear or branched alkyl containing one to 10 carbon atoms, preferably one to six carbon atoms; $CH_2-CH_2-OH$, $CH_2-CH(CH_3)-OH$, $CH_2-CH_2-CH_2-CH_2-OH$; $CH_2-CH_2-O-[C(O)-(CR''R''')_n-O]H$ wherein R'' and R''' are hydrogen or alkyl containing from one to three carbon atoms, preferably hydrogen, n is from 3 to 8, preferably 5 or 6, and m is from 1 to ten, preferably from 1 to 3, and most preferably two; $R_{10}-O-C(O)-C(R)=CH_2$ wherein $R_{10}$ is linear or branched alkyl containing from 2 to 12 carbon atoms, preferably from 2 to 8 carbon atoms, $CH_2-CH_2-O-CH_2-CH_2$; trimethylolpropane mono-, di-, and triacrylates which have the following Formulas VIII, IX or X respectively:

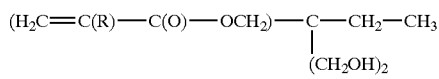

Formula VIII

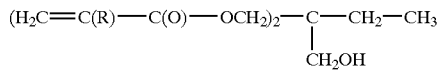

Formula IX $$(H_2C=C(R)-C(O)-OCH_2)_3-C-CH_2-CH_3 \quad \text{Formula X}$$

wherein R is hydrogen or methyl; pentaerythritol mono-, di-, tri-, and tetra-acrylates, which have the following Formulas XI, XII, XIII and XIV respectively:

$$(CH_2=C(R)-O-CH_2)-C-(CH_2-OH)_3 \quad \text{Formula XI}$$

$$(CH_2=C(R)-O-CH_2)_2-C-(CH_2-OH)_2 \quad \text{Formula XII}$$

$$(CH_2=C(R)-O-CH_2)_3-C-CH_2-OH \quad \text{Formula XIII}$$

$$(CH_2=C(R)-O-CH_2)_4-C \quad \text{Formula XIV}$$

wherein R is hydrogen or methyl; alkoxylated derivatives of trimethylolpropane, pentaerythritol or a mixture thereof (i.e., reaction products of an alkylene oxide and trimethylolpropane, pentaerythritol, or a mixture thereof) that have been converted into acrylates, such as alkoxylated trimethylolpropane acrylate wherein the alkoxy group has 2 to about 4 or more carbon atoms; bornyl acrylates; 2-phenoxyethyl acrylate, and the like. Illustrative of such acrylates are methyl, ethyl, propyl, butyl, pentyl, and the like acrylates; neopentyl glycol diacrylate, trimethylolpropane mono-, di- and triacrylate, pentaerythritol mono-, di-, tri-, and tetra-acrylates; bornyl, isobornyl, norbornyl and isonorbornyl acrylate; 2-hydroxyethyl acrylate, hydroxypropyl acrylate, hydroxybutyl acrylate, ε-caprolactone derivatives (i.e., reaction products) of 2-hydroxyethyl acrylate and other hydroxylalkyl acrylates wherein the alkyl group has 2 to about 4 carbon atoms as described in U.S. Pat. No. 4,683,287; giycidyl acrylate; bisphenol A diacrylate and ethoxylated bisphenol A diacrylate, cyclohexane dimethanol diacrylate and alkoxylated cyclohexane dimethanol diacrylate, poly(ethylene glycol) diacrylates; 2,2-dimethyl-3-hydroxypropyl-2,2-dimethyl-3-hydroxypropionate acrylates; 2-hydroxyethyl, hydroxypropyl, (4-hydroxymethylcyclohexyl)-methyl, 4-hydroxybutyl, and the like acrylates; silica organosols of acrylates such as the products commercially available from Clariant Corp. as Highlink OG 100-31, OG 10832, OG 120-33, OG PO33F-33; oligomeric acrylates such as the commercially available acrylates derived from the diglycidyl compounds of bisphenol-A and known in the industry as epoxy acrylates or acrylated epoxides, as depicted in Formula XV below:

Formula XV

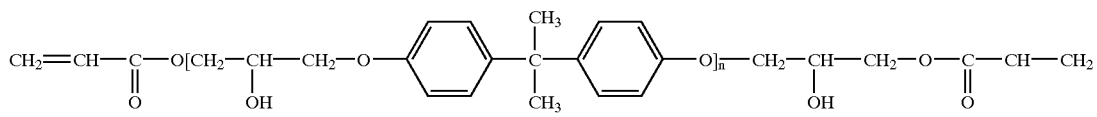

wherein n is from 1 to about 30 or more preferably from about 10; commercially available oligomeric acrylates derived by reaction of polyols, polyisocyanates, and optionally glycols, and known in the industry as urethane acrylates, as depicted in Formula XVI below for a polyester urethane acrylate wherein toluene diisocyanate was used to cap the polyester and leave isocyanate functionality for reaction with hydroxyethyl acryl ate:

available from Penn Color Inc. in epoxy dispersion form. A variety of colors can be made by blending one or more pigments as is well known by those skilled in the art of color formulation. When pigments are used, they are present in an amount of from about 0.005 parts to about 250 parts, preferably from about 0.01 to about 150 parts, and most preferably from about 0.05 to about 100 parts by weight per 100 parts by weight of cycloaliphatic epoxide.

Formula XVI

; and the like. When optionally used in cationic-curable compositions, the acrylates are present in an amount of up to about 50 parts, preferably up to about 35 parts by weight per 100 parts by weight of cycloaliphatic epoxide.

Preferred acrylates include one or more of (a) s-caprolactone derivatives (i.e., reaction products) of hydroxylalkyl acrylates wherein the alkyl group has 2 to about 4 carbon atoms; (b) alkoxylated trimethylolpropane acrylates wherein the alkoxy group has 2 to about 4 carbon atoms; (c) acrylated epoxides; and (d) urethane acrylates.

The cationic radiation-curable compositions can also contain substituted and unsubstituted, linear or cyclic vinyl ethers that are known to cure by a cationic mechanism, and that can act as reactive diluents, flexibilizers, cure rate enhancers, and the like. Illustrative of such vinyl ethers are acrolein dimer, acrolein tetramer, 1,4-cyclohexanedimethanol divinyl ether, 1,4-cyclohexanedimethanol monovinyl ether, diethylene glycol divinyl ether, triethylene glycol divinyl ether, tripropylene glycol divinyl ether, dipropylene glycol divinyl ether, butyl vinyl ether, 2-ethylhexyl vinyl ether, n-dodecyl vinyl ether, n-octadecyl vinyl ether, cyclohexyl vinyl ether, 1,6-hexanediol divinyl ether, propenyl vinyl ether of propylene carbonate, and the like. When used, the vinyl ethers are present in an amount of less than about 40 parts by weight per 100 parts by weight of cycloaliphatic epoxide.

The cationic radiation-curable compositions of the invention can contain suitable vinyl monomers that contain ethylenic unsaturation that will respond to radiation-generated free radicals and thus not interfere with the radiation-cure process. Illustrative of such vinyl monomers are styrene, vinyl acetate, vinyl pyrrolidone, vinyl caprolactam, vinyl esters, and the like. Compounds such as vinyl pyrrolidone and vinyl caprolactam are often used in commercial formulations as reactive diluents.

The cationic radiation-curable compositions of the invention may contain a variety of pigments that do not interfere with the curing process. Pigments that have an inherent basic or alkaline character or that are coated with a basic or alkaline substance are not suitable for use in the cationic-curable compositions of the invention. Illustrative of suitable pigments are titanium dioxide, carbon black, Graphtol fire red pigment 3RD1 (Sandoz), metal powders, Moly orange, Perylene Scarlet, Rhodamine-blue shade, Rhodamine-yellow shade, Red Lake C, PCN Blue-green shade, PCN Green-yellow shade, PCN Green-blue shade, brown iron oxide, raw umber, red mercuric oxide, yellow mercuric oxide, pearlescent pigments, mica, red and yellow mercury (II) oxide, and the like. Many of these colorants are The free-radical-curable compositions typically include at least one acrylate, preferably two or more acrylates, and at least one free-radical-generating photoinitiator. However, the amount of photoinitiator can be reduced or even eliminated if electron beam curing is used to supplement or replace ultraviolet light curing. Suitable acrylates include those described above. Optionally, the free-radical-curable compositions can also include suitable vinyl monomers as described above, sensitizers, pigments or other colorants, fillers, solvents, surfactants, or other ingredients known to those skilled in the art of coating, ink, adhesive, and sealant formulation. Suitable free-radical-generating photoinitiators for use in the free-radical-curable formulations include benzophenone, 4,4'-bis(N-ethyl-N-methylamino) benzophenone, and 4,4'-bis(p-isopropylphenoxy) benzophenone; benzil alkylketals such as benzil dimethylketal; benzoin alkyl and aryl ethers such as, benzoin diethyl ether, benzoin dipropyl ether, the benzoin n-butyl ethers, benzoin neopentylene ketal, benzoin phenyl ether, benzoin isopropylether, benzoin thioethers, and the like; methyl-o-benzoylbenzoate; ethyl-4-(dimethylamino) benzoate, 2-hydroxyl-2-methyl-1-phenyl-propan-1-one, oligo(2-hydroxy-2-methyl-1-4(1-methylvinyl) phenylpropanone which is available in monomeric, polymeric and emulsion forms, trimethylbenzophenone, methylbenzophenone, acetophenone, 2,2-diethoxyacetophenone, 2,2-dimethoxy-2-phenylacetophenone, 2,2-dimethyl-2-hydroxy acetophenone, 2-ethoxy-2-isobutoxyacetophenone, 1-hydroxycyclohexylphenyl acetophenone, benzil, 4-phenylbenzophenone, 2-chlorothioxanthone, 1,3-dimethyl-2(2-ethylhexyloxy)9H-thioxanthen-9-one, 4,4'-bis (N-ethyl-N-methylamino)benzophenone, 1,3-dimethyl-2(2-ethylhexyloxy)-9H-thioxanten-9-one, 4,4'-bis(p-isopropylphenoxy)benzophenone, methyl-o-benzoylbenzoate, benzophenone/maleimide blends, acylphosphine oxides, pivaloyldiphenylphosphine oxide, 2,6-dichlorobenzoyldiphenylphospine oxide, oligo(2-hydroxy-2-methyl-1,4-(1-methylvinyl)phenyl)propanone, 2-hydroxy-2-methyl-1-phenyl-1-propanone (monomeric), and the like. Also suitable are alpha-aminoalkylphenones such as 2-benzyl-2-dimethylamino-1-(4-morpholinophenyl) butan-1-one sold as Irgacure 369 and 2-methyl-(1-(4-methylthio)phenyl)-2-morpholino-propan-2-one sold as Irgacure 907. Also suitable are the acylphosphine oxides such as the monoacylphosphine oxides and bis-acylphospine oxides sold as Irgacure 819, 1700, and 1800. Preferred free-radical-generating photoinitiators include benzophenone, 2,2-diethoxyacetophenone, oligo(2-hydroxy-2-methyl-1,4-(1 -methylvinyl)phenyl)propanone, and 2-hydroxy-2-methyl-1-phenyl-1-propanone (monomeric). If desired, the above described cationic photoinitiators that generate free radicals during the photolysis process can be used to initiate the free-radical curable compositions of the invention. The photoinitiators for the free-radical curable compositions are used in an amount of from about 0.05 to about 25 parts, preferably from about 0.1 to about 15 parts, and most preferably from about 0.2 to about 10 parts by weight per 100 parts by weight of the acrylates or mixture of acrylates.

In certain instances, it is advantageous to utilize a synergist with the free radical-generating photoinitiators such as benzophenone, benzils, and the like. A synergist is a compound that contains a carbon atom with at least one hydrogen atom in the alpha position to a nitrogen atom, such as the three carbon atoms in triethylamine

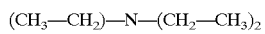

that are attached to the nitrogen atom and are alpha carbon atoms.

Illustrative of synergists are the tertiary amines, amines, and ureas which may be in simple organic chemical, oligomeric, or polymeric form, such as dimethylethanolamine, triethylamine, triethanolamine, methyldiethanolamine, , N-methyldiethanolamine, 2-ethyl-p-(N,N-dimethylamino)benzoate, 2-ethylhexyl-p-(N,N-dimethylamino)benzoate, N,N-dimethyl-p-toluidine, 2-(dimethylamino)ethylbenzoate, 2-n-butoxyethyl-4-dimethylamino)benzoate, 4,4'bis(N,N'-dimethylamino) benzophenone, and the like. Preferred synergists include triethylamine and N-methyidiethanolamine. Synergists can interact with certain photoinitiators, such as benzophenone, to form other initiating free radicals, and said other initiating free radicals can decrease the oxygen inhibition difficulty that exists with certain photoinitiators and is well known to those skilled in the art of formulating free-radical curable coating compositions.

Optionally, one can add adhesion promoters to the compositions of this invention. Illustrative of these are the various compounds commercially available from Sartomer Co. under various product codes such as CN704 (an acrylated polyester), SR9008 (an alkoxylated difunctional monomer), SR9012 (a trifunctional acrylate monomer), SR9016 (a metallic diacrylate), SR9050 (a monofunctional acid ester), SR9051 (a trifunctional acid ester), SR9052 (a trifunctional acid ester), and the like.

Optionally, the cationic and free-radical radiation-curable compositions may contain a fluorescent dye to act as a means of marking coated areas when viewed under black light, which is also known as ultraviolet (UV) light. Illustrative of such fluorescent dyes are Calcafluor™ White RWP (American Cyanamid), Fluorescent Brightener 28 (Aldrich Chemical), and the like. Such dyes are particularly useful in the preparation of conformal coatings for use on printed circuit assemblies to protect them from hostile environments or other objects that might be inspected to ascertain complete coating coverage. When present, the fluorescent dye is used in an amount of about 0.01 part or less to about 0.3 part or more with the preferred amount from about 0.01 part to about 0.15 part by weight per 100 parts by weight of the cycloaliphatic epoxides, acrylates, or mixture of epoxides and acrylates.

In addition to adding dyestuffs as colorants, small amounts of certain dyestuffs optionally may be added to the cationic and free-radical curable coatings of the invention to improve the color or hide yellowing in coatings, inks, adhesives, or sealants. Illustrative of such dyestuffs are NLE 259121, a blue dyestuff commercially available from BASF Corp. as Thermoplast Blue 684, UVITEX™ OB from Ciba Specialty Chemicals Corp., and the like. When present, such dyestuffs used as colorants or to hide yellowing are used in small amounts of about 0.05 part to about 2.0 parts by weight per 100 parts by weight of the cycloaliphatic epoxides, acrylates, or mixture of epoxides and acrylates.

Visible light photoinitiators include compounds such as D,L-camphorquinone, Xanthene dyes such as Rose Bengal, fluorones, and the like. Many compounds for use in visible light photoinitiation are described in U.S. Pat. No. 4,512,340.

The photocurable compositions of the invention may also contain other ingredients such as one or more surfactants, flow and leveling agents, defoamers, fumed silicas, fillers, alumina, silicone oils, slip agents, viscosity modifiers, tackifiers, adhesion promoters, thixotropes or other thickeners, cellulose acetate/butyrate polymers; phenoxy polymers; castor oil; inert polymers such as the vinyl chloride/vinyl acetate copolymers; functional vinyl chloride/vinyl acetate terpolymers such as vinyl chloride/vinyl acetate/vinyl alcohol terpolymers, vinyl chloride/vinyl acetate/hydroxypropyl acrylate terpolymers, vinyl chloride/vinyl acetate/glycidyl acrylate terpolymers, and the like; acrylate copolymers and terpolymers such as ethyl acrylate/butyl acrylate copolymers, ethyl acrylate/butyl acrylate/hydroxyethyl acrylate terpolymers and the like; and other ingredients known to those skilled in the art of formulating coatings, inks, adhesives, and sealants. The term thickeners includes the new associative thickeners as described by Johan Bieleman, Paint and Coatings Industry, XV (11), 46 (Nov. 1999).

The coating compositions optionally also may contain or be dissolved or dispersed an inorganic or organic diluent in order to decrease viscosity, as is well known in the art. Any of the conventional inert solvents used in the coating industry can be used at a concentration of less than about 100 parts, preferably less than 50 parts by weight per 100 parts by weight of the cycloaliphatic epoxides, acrylates or mixture of epoxides and acrylates. Suitable solvents include acetone, methyl ethyl ketone, amyl ketone, amyl acetate, methylene chloride, and other solvents that will not react appreciably with the composition ingredients. Conceivably, larger amounts of solvent could be used, but the use of larger amounts of solvent would negate or lessen one of the benefits of radiation-curable compositions, which are considered to be essentially 100% solids coating systems. Generally inert solvents are added to reduce viscosity and to improve flow ability during application of the curable compositions to a substrate.

In preparing the radiation-curable compositions of the invention, the ingredients are mixed by conventional procedures used in the production of inks, paints, coatings, adhesives, and sealants. The procedures are so well known to those skilled in the art that they do not require further discussion here. However, it should be noted that when a photoinitiator and/or photosensitizer is used and is incorporated into the curable compositions of this invention, it is necessary that the curable compositions be mixed or blended under "safe light" conditions such as a yellow light source or properly doped fluorescent bulbs to obviate or minimize early photolysis which could result in storage instability or even runaway polymerization in bulk during manufacture or storage.

The curable compositions of the invention can be applied to a suitable surface or substrate, illustrative of which are wood, paper, metal, plastics, ceramics, graphite, and the like;

and by conventional means such as spray, brush, dipping, spin coating, roll coating, vacuum deposition, gravure processes, and the like. Photopolymerization or curing of the compositions occurs on exposure of the compositions to actinic radiation at a wavelength within the ultraviolet and visible portions of the electromagnetic spectrum that is capable of interacting with the photoinitiator to cause photolysis. Exposure to the energy source may be from less than about one second to as long as about 10 minutes or more, depending on the various ingredients used, the particular radiation source, the distance of composition from the radiation source, and the thickness of the coating to be cured.

Without wishing to be bound as to theory, the curing of the cationic-curable compositions is often what may be called a triggered reaction. Once the degradation or photolysis of the photoinitiator and/or photosensitizer has begun by exposure to a radiation source, the reaction proceeds and will continue, if incomplete, after removal of the radiation source. The use of thermal energy, even in moderate amounts, during or after exposure to a radiation source will greatly enhance the curing reaction of cationic-curable formulations. In the case of free-radical curing, the reactions are believed to be complete essentially immediately after removal of the radiation source.

Although this invention is not meant to be limited by any particular mechanism or theory, it is believed that the radiation-transmissible materials act as radiation pipes that transmit the incident radiation throughout various regions of the coating, ink, sealant, adhesive, or composite interior where it causes photoinitiator and/or photosensitizer to photolyze and generate cations and free radicals in the case of the cationic photoinitiators and free radicals in the case of the free radical photoinitiators. These initiating species then cause polymerization of epoxides, copolymerization of epoxides, polyols, vinyl ethers, and, if present, acrylates in the cationic case, and of ethylenically unsaturated materials such as acrylates, styrene, and the like in the free radical case. This piping or transmission of the radiation energy to the interior portions of the coating, ink, adhesive, sealant, composite, or other article allows clear, thick clear, and thick opaque and/or colored materials to be cured thoroughly (i.e., deeply and uniformly) in relatively short times with cure time dependent on amount of photoinitiator, radiation source intensity, distance from the radiation source, particular wavelengths transmitted to the material by the radiation source, as well as other factors.

Photopolymerization is carried out by exposing the radiation-curable compositions (such as films, coatings, inks, adhesives, sealants, or composites) to electromagnetic radiation. The preferred type of radiation used to initiate cure of the cationic-curable compositions of this invention is ultraviolet light and visible light, preferably having a wavelength from about 180 nanometers to about 600 nanometers, although with certain photoinitiators ultraviolet light may be used alone and with others visible light may be used alone. The preferred type of radiation used to initiate cure of the free-radical curable compositions of this invention is ultraviolet light. However, electron beam radiation can be used to supplement or replace ultraviolet light. Such electron beam radiation can reduce or eliminate the need for photoinitiators in the cationic-curing or free-radical-curing process. However, it is noted that the radiation-transmissible materials will not interfere with electron beam curing even though they may not be required.

Illustrative of appropriate radiation sources are medium and high pressure mercury vapor lamps, electrodeless mercury-vapor lamps, xenon lamps, lasers, carbon arcs, sunlight, and the like. It is known to those skilled in the art of mercury vapor lamp development that various doping compounds can be added to the mercury in mercury lamps to enhance particular wavelengths or to block particular wavelengths, and that other doping agents can be added to the lamp bodies to alter radiation transmission characteristics. Heat (such as that provided by an infrared radiation source or a thermal source) may be used to supplement radiation curing in order to improve flow and leveling properties of the compositions of this invention prior to cure.

The solid forms of the radiation-curable compositions of the invention are useful as powder coatings for coating decorative and functional objects and that would be cured by a thermal heating flow process followed by radiation exposure. The cured compositions of the invention may have very good abrasion resistance and are useful as coatings and inks for metal, paper, plastics, glass, ceramics, and wood, as adhesives, as sealants, and as composite materials. The cured compositions of this invention also are useful in biomedical and dental applications, including prosthetic devices such as dentures; coatings, fillings, and caps for teeth; and the like.

In a particular embodiment of the invention, the radiation-curable compositions of the invention can be combined with various structural fibers and radiation cured to form useful composite materials. Illustrative of the structural fibers useful with the compositions are carbon, graphite, glass including optical fibers, silicon carbide, polybenzothiazole, alumina, titania, boron, aromatic polyamide, and the like. The fibers can be used in various forms, illustrative of which are monofilaments, continuous tows of up to about 400,000 and more filaments each, woven cloth, whiskers, chopped fiber or random mat, and the like. Such composites have a variety of end uses such as printed circuit boards, shaped parts of various types, sound and video carrying systems, and the like. In the case of optical fibers, the fibers may be coated in single filament or multi-filament form. Pigmented or otherwise colored radiation-curable compositions are useful as marking materials for optical fibers and similar items. Other specialty uses for the radiation-curable compositions of the invention include photoresists, solder masks, conformal coatings, inks including ink-jet inks, adhesives, and sealants, among others. The electrical properties, particularly insulation resistance, of cured cycloaliphatic epoxides makes the cured compositions of the invention particularly useful as conformal coatings for printed circuit assemblies. Fiber-glass-composite printed-circuit assemblies and similar composites that are made of ceramic materials can have the cationic-cured coatings easily and cleanly removed without carbonization by a burning or firing operation during repair. Such clean removal is important to reuse of sophisticated electronic assemblies. Further, ceramic compositions when combined with the cationic-curable compositions of this invention can be cured to prepare ceramic green-ware that can be fired cleanly to prepare ceramic objects that are useful as printed circuit board stock, decorative objects, functional objects, insulators, and the like.

In another particular embodiment of this invention, the radiation-curable compositions are made into solid particles by using a mixture of ingredients that will crystallize, vitrify, or otherwise solidify after combination or after lowering the temperature. These solid materials can be ground by conventional means or special means illustrative of which is fluid energy milling to form powders or can be spray dried from a melt or emulsion to form a powder during a cooling or drying operation. Such powders can be applied by electrostatic spray or fluidized-bed methods. After application to a substrate, the powders would be melted at a relatively low temperature and then cured with ultraviolet or visible light. It may be necessary to store certain of these powders at temperatures below room temperature to prevent blocking. Such powders are useful as powder coatings, as photocopier toners, and the like.

EXAMPLES

The following examples are presented for the purpose of illustrating the invention disclosed herein in greater detail. However, the examples are not to be construed as limiting the invention here in any manner, the scope of the invention being defined by the appended claims.

List of Tests Used

Crosshatch Adhesion: This test was performed in accordance with ASTM D 3359.

Surface Cure Test: This test is known by those skilled in the art, and it measures the surface cure rate. This cotton-ball dab test is performed by lightly pressing a cotton ball to the surface of the coating. Clean removal of the cotton ball without marring the surface indicates the surface of the coating has been cured. In stationary light source studies, as might be conducted in natural sunlight or with a sunlamp, the coating is periodically tested, and the time required to achieve clean removal of the cotton ball without marring is recorded as the "cure rate." The shorter the cure rate, the more rapidly the surface of the coating has been cured. When studies with conveyors moving a coated substrate past a synthetic radiation source at a movement rate expressed in feet per minute ["fpm"]) are investigated, the test is performed immediately after the coating leaves the light source.

Although surface cure is of interest, through cure (which follows) is of more importance.

Through Cure Test: This test is known by those skilled in the art, and it measures the requirements needed to cure through the entire coating, i.e., from the surface through to the substrate. In involves a twisting of one's thumb, and is performed by pressing the thumb with moderate pressure onto the radiation exposed coating and twisting it through 90 degrees. If the coating is disrupted, i.e., tears, twists, wrinkles, or mars, the coating is not cured through. The test usually is applied immediately after removing the specimen from the light source. However, in certain instances the test is performed after some specified time in order to determine the influence of "time after exposure" on the cure.

List of Ingredients Used

Acrylate I: Trimethylolpropane triacrylate commercially available from Sartomer Co., Inc. as SR351 HP.

Acrylate II: Aliphatic urethane acrylate commercially available from Sartomer Co., Inc. as CN 981, CN 968, CN 980 or equivalent.

Acrylate III: Ethoxylated trimethylolpropane triacrylate commercially available from Sartomer Co., Inc. as SR 502.

Brightener I: Uvitex™ OB, commercially available from Ciba Specialty Chemicals Corp.

Defoamer I: A polysiloxane defoamer commercially available from BYK-Chemie USA.

Dye I: Dye NLE 259121, a blue dyestuff commercially available from BASF Corp. as Thermoplast Blue 684.

Dye II: A fluorescent dye of unknown composition commercially available from American Cyanamid Co. as Calcafluor™ White RWP.

Epoxide I: 3,4-epoxycyclohexylmethyl-3,4-epoxycyclohexane carboxylate, viscosity 220-250 cP at 25° C., and commercially available from Union Carbide Corp. as Cyracure® Resin UVR-6105.

Epoxide II: Limonene diepoxide, an epoxide diluent, and commercially available from Elf Atochem North America.

Epoxide III: 3,4-epoxycyclohexylmethyl-3,4-epoxycyclohexane carboxylate, viscosity 350-450 cP at 25° C., and commercially available from Union Carbide Corp. as Cyracure® Resin UVR-6110.

Epoxide IV: Bis-(3,4-epoxycyclohexyl)adipate, commercially available from Union Carbide Corp. as Cyracure® Resin UVR-6128.

Filler I: Hydrated alumina (also called aluminum oxide trihydrate), a white, crystalline powder which is commercially available from Alcoa Industrial Chemicals, Div. of Alcoa Co. of America, Milford, Conn.

Photoinitiator I: A diaryliodonium hexafluoroantimonate salt in a solvent, and commercially available from Sartomer Company, Inc. as SarCat CD-1012.

Photoinitiator II: Mixed arylsulfonium hexafluoroantimonate salts as a solution in propylene carbonate, and commercially available from Union Carbide Corp. as Cyracure® UVI 6976.

Photoinitiator III: Oligo(2-hydroxy-2-methyl-1,4-(1-methylvinyl)phenyl)propanone and 2-hydroxy-2-methyl-1-phenyl-1-propanone (monomeric) commercially available from Sartomer Col, Inc. as Esacure™ KIP100F.

Photosensitizer I: Isopropyl thioxanthone, a photosensitizer that functions as a photopolymerization initiator, and commercially available from Aceto Corp. as SPEEDCURE ITX.

Pigment I: A 50% by weight dispersion of titanium dioxide in Cyracure® Resin UVR-6110, and commercially available from Penn Color, Inc. as $TiO_2$ Epoxy Paste #18W286.

Pigment II: Exterior Mearlin Micro White, commercially available from Engelhard Corp.

Pigment III: A 20% by weight dispersion of carbon black in Cyracure® Resin UVR-6110, and commercially available from Penn Color, Inc. as Carbon Black Paste.

Pigment IV: Finely divided titanium dioxide pigment, commercially available from Kerr-McGee Chemical LLC, Oklahoma City, Okla. as TRONOX™ CR-826.

Pigment V: Finely divided carbon black pigment solids, commercially available from Degussa-Hulls Corp.

Polyol I: A trifunctional poly-s-caprolactone polyol with an average molecular weight of about 300, and commercially available from Union Carbide Corp. as TONE™ 0301.

Polyol II: A trifunctional poly-E-caprolactone polyol with an average molecular weight of about 540, and commercially available from Union Carbide Corp. as TONE™ 0305.

Polyol III: A difunctional poly(tetramethylene oxide) polyol with an average molecular weight of about 1000, and commercially available from DuPont Co. as TERATHANE™ 1000.

Surfactant I: Silwet™ L-7604, commercially available from Witco Corp.

UV Source I: A synthetic ultraviolet light source consisting of a gallium-doped, mercury V bulb with the designation F-600V, located in a microwave powered curing unit equipped with a conveyer, and commercially available from Fusion UV Systems, Inc., Gaithersburg, Md.

UV Source II: A synthetic ultraviolet light source consisting of a medium-pressure mercury vapor lamp having a peak irradiance of about 360 nanometers and an output of 300 watt/inch, located in microwave powered curing unit equipped with a conveyer, and commercially available from Nordson UV Systems, Amherst, Ohio.

UV Source III: A synthetic ultraviolet light source consisting of an iron-doped arc lamp with an output of 500 watt/inch, located in a curing unit equipped with a conveyer, and commercially available from Nordson UV Systems, Amherst, Ohio.

UVT-1: A radiation-transmissible material that is a finely-divided, non-crystalline, fused-quartz powder with a particle size of less than 10 microns and ranging in size from about 0.1 microns to about 10 microns. It has an ultraviolet light transmittance of 90% or more for radiation having a wavelength of 260 nanometers for a sample thickness of 1000 microns, and having a refractive index of about 1.44–1.47 (Becke Line). It is available from MO-SCI CORP., Rolla, Mo.

UVT-2: A radiation-transmissible material comprised of finely divided borosilicate glass spheres with a particle size of less than 20 microns and ranging in size from about 1 micron to about 20 microns. It has an ultraviolet light transmittance of 90% or more for radiation having a wavelength of 300 nanometers for a sample thickness of 1000 microns, and having a refractive index of about 1.48–1.49 (Becke Line). It is available from MO-SCI CORP., Rolla, Mo.

UVT-3: A radiation-transmissible material that is a finely divided, fused amorphous silicate spheres and semi-spheres with a particle size of less than 5 microns and ranging in size from about 0.1 microns to about 5 microns. It has an ultraviolet light transmittance of 90% or more for radiation having a wavelength of 275 nanometers for a sample thickness of 1000 microns, and having a refractive index of about 1.45–1.48 (Becke Line). It is available from MO-SCI CORP., Rolla, Mo.

UVT-4: A radiation-transmissible material comprised of finely divided borosilicate glass spheres with a particle size of less than 74 microns and ranging in size from about 20 micron to about 74 microns. It has an ultraviolet light transmittance of 90% or more for radiation having a wavelength of 300 nanometers for a sample thickness of 1000 microns, and having a refractive index of about 1.48–1.49 (Becke Line). It is available from MO-SCI CORP., Rolla, Mo.

Control A and Example 1

Substrates for the coatings of Control Coating A and Example 1 Coating were prepared by placing the ingredients for the cationic wood sealer described in Table I in a glass container and blending well by stirring. Six-inch squares of plywood were coated with the sealer by drawing it down with a wire-wound draw-down bar and then curing the sealer coating to a clear, hard finish by exposure to sunlight. Prior to application of Control Coating A and Example 1 Coating, the sealer-coated plywood substrate was sanded lightly using 20 strokes with 180 grit sandpaper.

The ingredients listed in Table I for Control A and Example 1 were placed in separate glass containers and blended well by stirring to prepare white coating formulations. The white coating formulations then were applied to the above-described sanded, cured-sealer-coated plywood substrates at a wet coating thickness of 1, 2, and 3 mils (1 mil=0.001 inches). The coatings were cured either using natural sunlight, which has a high ultraviolet light content, or with UV Source I. The surface and through cure rates are given in Table II. It should be pointed out that cationic systems such as these undergo very little (about 2%) shrinkage during cure, and wet thickness is essentially the same as cured thickness.

TABLE I

| Ingredients (parts by Weight) | Cationic Wood Sealer | Control A | Example 1 |
|---|---|---|---|
| Epoxide I | — | 88.773 | 88.773 |
| Epoxide II | 2.591 | 11.227 | 11.227 |
| Epoxide III | 97.409 | — | — |
| Polyol I | 33.742 | 41.240 | 41.240 |
| Photoinitiator I | — | 6.439 | 6.439 |
| Photoinitiator II | 2.461 | — | — |
| Photosensitizer I | 0.125 | 0.468 | 0.468 |
| Pigment I | — | 63.865 | 63.865 |
| Dye I | — | 0.011 | 0.011 |
| Surfactant I | 0.274 | — | — |
| Defoamer I | 0.429 | 0.851 | 0.851 |
| UVT-1 | — | — | 29.270 |
| UVT-2 | 13.718 | — | 58.541 |
| UVT-3 | 27.437 | — | — |
| Coating Color | Clear | White | White |

TABLE II

| Property | Control A | | | Example 1 | | |
|---|---|---|---|---|---|---|
| Thickness, mils | 1 | 2 | 3 | 1 | 2 | 3 |
| Cure Rate with Sunlight* | | | | | | |
| Surface, min. | — | — | 1.5 | — | — | 3.5 |
| Through, min. | — | — | 180 | — | — | 17 |
| Cure Rate with UV Source I | | | | | | |
| Surface, fpm | 210 | 290 | 150 | 190 | 165 | 105 |
| Through, fpm | 15 | 5 | 1 | 90 | 65 | 45 |
| Crosshatch Adhesion, % | 75 | 25 | 10 | 100 | 100 | 100 |

*Sunny clear day in Canton, OH, between the hours of 11:00 a.m. and 3:00 p.m. on June 1999, ambient temperature about 72° F.

Thus, the coatings of Example 1, which contained the radiation-transmissible materials, cured through in markedly less time in sunlight and at a significantly faster conveyor rate, i.e., with less exposure time, than the control under the synthetic light source. Although surface cure was somewhat better for the control, curing at the surface is essentially independent of pigment opacity, which has more effect on the bulk of the material being cured as measured by through cure. In addition, the more thorough through cure for Example 1 in contrast to the Control is evidenced by the higher crosshatch adhesion values for Example 1. This increased cure rate and property improvement was attained at an overall lower photoinitiator system concentration, even though formulation guidelines published by Union Carbide Corp. in "Cyracure® Cycloaliphatic Epoxides Cationic UV Cure", 1997, state on p. 19 that cure rate is proportional to cationic photoinitiator concentration, and on p. 22 that cure rate is increased by using more photoinitiator.

Example 2

The ingredients listed in Table III for Example 2 were placed in glass containers and blended well by stirring. The white coating formulation was then applied to aluminum Q-panels at wet coating thickness, which is essentially the same as cured coating thickness, of 1, 2, and 3 mils (1 mil=0.001 inches) using a wire-wound draw-down bar. The coatings were cured either using natural sunlight, which has a high ultraviolet light content, or with UV Source II. The surface and through cure rates are given in Table 4 and demonstrate that thick coatings can be through cured at reasonable conveyer speeds and with the use of a low photoinitiator concentration. The resultant coatings were white in color, hard, tough, adherent, and glossy.

TABLE III

| Ingredients (parts by weight) | Example 2 | Example 3 | Example 4 | Control B | Example 5 |
|---|---|---|---|---|---|
| Epoxide I | 92.283 | 46.320 | 33.784 | 33.307 | — |
| Epoxide II | 7.717 | 5.175 | 5.086 | — | 2.591 |
| Epoxide III | — | 37.252 | 63.130 | 66.693 | 97.409 |
| Epoxide IV | — | 11.253 | — | — | — |
| Polyol I | 35.374 | 40.242 | 36.015 | 37.859 | 33.742 |
| Pigment I | 21.471 | 5.401 | 0.814 | 0.893 | — |
| Pigment II | 2.827 | 1.530 | 0.212 | 0.227 | — |
| Pigment III | 0.026 | 0.180 | 2.120 | 3.029 | — |
| Filler I | — | — | 1.271 | 0.334 | — |
| Photoinitiator I | 1.700 | 1.922 | 1.271 | — | — |
| Photoinitiator II | — | — | — | 6.214 | 2.461 |
| Photosensitizer I | 0.361 | 0.406 | 0.256 | 1.243 | 0.125 |
| Dye I | 0.008 | 0.008 | 0.007 | 0.006 | — |
| Brightener I | 0.637 | — | — | — | — |
| Defoamer I | 0.616 | 0.406 | 0.377 | 0.388 | 0.429 |
| Surfactant I | 0.304 | — | — | — | 0.274 |
| UVT-2 | 38.627 | 20.001 | — | — | 13.718 |
| UVT-3 | 10.633 | — | — | — | 27.438 |
| UVT-4 | — | 20.001 | 31.780 | — | — |
| Coating Color | White | Grey | Charcoal Black | Charcoal Black | Clear |

TABLE IV

| Property | Example 2 | | |
|---|---|---|---|
| Thickness, mils | 1 | 3 | 5 |
| Cure Rate with Sunlight* | | | |
| Surface, min. | <7 | <7 | <7 |
| Through, min. | 15 | 20 | 30 |
| Cure Rate with UV Source II | | | |
| Surface, fpm | — | — | — |
| Through, fpm | — | 20 | 12 |

*Sunny, clear day in Canton, OH, between the hours of 11:00 a.m. and 3:00 p.m. on April 16, 2000, ambient temperature about 72° F.

Example 3

The ingredients listed in Table III for Example 3 were placed in glass containers and blended well by stirring. The gray coating formulation was then applied to aluminum Q-panels at the wet coating thickness, which is essentially cured coating thickness, indicated in Table V using a wire-wound draw-down bar. The coatings were cured using natural sunlight, which has a high ultraviolet light content, with UV Source II, or with UV Source III. The surface and through cure rates are given in Table V and exemplify that even very thick coatings can be through cured at reasonable conveyer speeds and with the use of a low photoinitiator concentration. The resultant coatings were gray in color, hard, tough, adherent, and glossy.

TABLE V

| Property | Example 3 | | | | | |
|---|---|---|---|---|---|---|
| Thickness, mils | 1 | 3 | 5 | 3 | 5 | 10 |
| Cure Rate with Sunlight* | | | | | | |
| Surface, min. | <6 | <6 | <6 | — | — | — |
| Through, min. | 12 | 18 | 25 | — | — | — |
| Cure Rate with UV Source II | | | | | | |
| Surface, fpm | — | — | — | — | — | — |
| Through, fpm | — | — | — | 20 | 15 | 8 |
| Cure Rate with UV Source III | | | | | | |
| Surface, fpm | — | — | — | — | — | — |
| Through, fpm | — | — | — | 35 | 20 | 13 |

*Sunny clear day in Canton, OH, between the hours of 11:00 a.m. and 3:00 p.m. on April 16, 2000, ambient temperature about 72° F.

Example 4

The ingredients listed in Table III for Example 4 were placed in glass containers and blended well by stirring. The charcoal black coating formulation was then applied to aluminum Q-panels at the wet coating thickness, which is essentially cured coating thickness, indicated in Table VI using a wire-wound draw-down bar. The coatings were cured using UV Source II. The surface and through cure rates are given in Table VI and demonstrate that even very thick coatings can be through cured at reasonable conveyer speeds and with the use of a low photoinitiator concentration. The resultant coatings were charcoal black in color, hard, tough, adherent, and glossy.

TABLE VI

| Property | Example 4 | | |
|---|---|---|---|
| Thickness, mils | 3 | 5 | 10 |
| Cure Rate with UV Source II | | | |
| Through, fpm | 20 | 15 | 8 |

Control B

The ingredients listed in Table III for Control B were placed in glass containers and blended well by stirring. The charcoal black coating formulation was then applied to aluminum Q-panels at the wet coating thickness, which is essentially cured coating thickness, of 3 mils, 5 mils, and 10 mils using a wire-wound draw-down bar. The coatings were cured using UV Source II at conveyer speeds of 20, 15, and 8 feet per minute (fpm), respectively. All coatings exhibited surface cure, but none were cured through, and all were unusable as coatings. The Control B formulation was then applied to the same kind of panels at a thickness of 0.5 mil and of 10 mil in the same manner described above. The 0.5 mil coating cured through at a conveyer speed of 25 fpm but the 1.0 mil coating did not cure through at a conveyer speed of 10 fpm and after a post-UV exposure time of five minutes. However, the exposed 1.0-mil coating did cure through after a post-exposure time of 24 hours at an ambient temperature of about 72° F. Thus Control B, which is closely related to the Example 4 coating except for radiation-transmissible materials, cured markedly slower (particularly at the larger thicknesses) than coatings containing radiation-transmissible materials.

Example 5

The ingredients listed in Table III for Example 5 were placed in glass containers and blended well by stirring. The clear coating formulation was then applied to aluminum Q-panels at the wet coating thickness, which is essentially cured coating thickness, indicated in Table VII using a wire-wound draw-down bar. The coatings were cured using natural sunlight, which has a high ultraviolet light content, with UV Source II, or with UV Source III. The surface and through cure rates are given in Table VII and demonstrate that even extremely thick coatings can be through cured at reasonable conveyer speeds and with the use of a low photoinitiator concentration when radiation-transmissible materials are present. The resultant coatings were clear and transparent, hard, tough, adherent, and glossy.

TABLE VII

| Property | Example 5 | | | | | |
|---|---|---|---|---|---|---|
| Thickness, mils | 1 | 3 | 5 | 10 | 13 | 25 |
| Cure Rate with Sunlight* | | | | | | |
| Surface, min. | 3 to 5 | 3 to 5 | 3 to 5 | — | — | — |
| Through, min. | 5 | 10 | 17 | — | — | — |
| Cure Rate with UV Source II | | | | | | |
| Surface, fpm | — | — | — | — | — | — |
| Through, fpm | | 20** | 50 | 35 | 20 | |
| Cure Rate with UV Source III | | | | | | |
| Surface, fpm | — | — | — | — | — | — |
| Through, fpm | — | — | 50 | 35 | 20 | 12 |

*Sunny clear day in Canton, OH, between the hours of 11:00 a.m. and 3:00 p.m. on June 1999, ambient temperature about 72° F.
**No attempt was made to cure this particular thickness at higher conveyer speeds.

Gray colored radiation-curable formulations were prepared from the ingredients listed in Table VIII by placing them in a metal container. Example 6 contained a radiation-transmissible material, and Control C was a control without the radiation-transmissible material. The ingredients were blended well by stirring. The coating formulations were then applied to 2-inch by 2-inch aluminum Q-panels at the indicated coating thickness using a wire-wound draw-down bar, and they were cured by exposure to UV Source II in one trial and to UV Source III in another trial. Through cure rates in feet per minute (fpm) are given in Table IX and exemplify that the coating of Example 6 cured much faster than Control C at various thicknesses and with two different ultraviolet light sources. At a thickness of 5 mils, Control C did not exhibit any degree of through cure even at the slowest possible conveyor belt speed.

TABLE VIII

| Ingredients, Parts by weight | Control C | Example 6 |
|---|---|---|
| Photoinitiator III | 1.63 | 1.63 |
| Acrylate I | 8.70 | 8.70 |
| Acrylate II | 42.39 | 42.4 |
| Acrylate III | 48.91 | 48.9 |
| Pigment II | 2.17 | 2.17 |
| Pigment IV | 5.43 | 5.43 |
| Pigment V | 0.05 | 0.05 |
| UVT-2 | 0 | 32.61 |

TABLE IX

| Property | Control C | | | Example 6 | | |
|---|---|---|---|---|---|---|
| Thickness, mils | 1 | 3 | 5 | 1 | 3 | 5 |
| Through Cure Rate, fpm | | | | | | |
| UV Source II | 20 | 5 | * | 40 | 20 | 5 |
| UV Source III | 20 | 5 | * | 50 | 30 | 10 |

*There was no through cure at the slowest possible conveyor best speed.

Examples 7–10

Ultraviolet-light-curable conformal coatings are prepared from the ingredients listed in Table X. (Conformal coatings are coatings that encapsulate a printed circuit board and its components. This complete envelope of encapsulating material provides protection from humidity, moisture, dust, fungus, and other contaminants. The envelope also enhances circuit reliability by eliminating current or voltage leakage from high impedance circuits.) The ingredients are placed in a glass container and blended well by manual stirring. The formulated coatings are applied to fiber glass/epoxy printed circuit boards containing a variety of components by a dipping operation. The coated boards are then radiation cured under UV Source II. In a similar manner, ceramic printed circuit boards with components are coated and cured. The cured conformal coatings are hard, tough, adherent, and have good moisture resistance and electrical insulation resistance properties.

TABLE X

| Ingredients, parts by weight | Example 7 | Example 8 | Example 9 | Example 10 |
|---|---|---|---|---|
| Acrylate I | — | — | 10.6 | 13.7 |
| Acrylate II | — | — | 48.8 | 45.7 |
| Acrylate III | — | — | 40.6 | 40.6 |
| Epoxide I | 90.2 | 90.2 | — | — |
| Epoxide II | 9.8 | 9.8 | — | — |
| Polyol II | 19.3 | — | — | — |
| Polyol III | — | 19.3 | — | — |
| Photoinitiator I | 1.80 | 1.80 | — | — |
| Photoinitiator III | — | — | 1.5 | 1.0 |
| Photosensitizer I | 0.25 | 0.25 | — | — |
| Dye II | 0.003 | — | 0.002 | — |
| Surfactant I | 0.50 | 0.50 | 0.1 | 0.5 |
| UVT-2 | 25.0 | 25.0 | 25.0 | 30.0 |

While in accordance with the patent statutes the best mode and preferred embodiment has been set forth, the scope of the invention is not limited thereto, but rather by the scope of the attached claims.

What is claimed is:

1. A laminate comprising:
   a radiation-cured coating composition, and a substrate,
   said coating composition comprising at least one solid, non-crystalline radiation transmissible material having a mean particle diameter from about 0.1 to about 5,000 microns, and is transparent at a thickness of 1,000 microns to at least about 60 percent of radiation having a wave length of from about 180 to about 600 nanometers; and
   one or more of (a) at least one cationic-curable composition comprising at least one polyfunctional cycloaliphatic epoxide, at least one polyol, and at least one cation-generating photoinitiator, or (b) at least one free-radical curable composition comprising at least one ethylenically-unsaturated compound comprising at least one acrylate, and at least one free-radical-generating photoinitiator.

2. A laminate according to claim 1, wherein said solid, non-crystalline, radiation-transmissible material comprises a borosilicate, a potash borosilicate, a soda borosilicate, a uviol glass, an amorphous silica, a vitreous silica, a fused silica, or a fused quartz, or combinations thereof.

3. A laminate according to claim 2, wherein said cycloaliphatic epoxide comprises a diepoxide;

wherein said acrylate comprises:
an ester of acrylic acid or methacrylic acid having the general formula:

$$CH_2=C(R)-C(O)-O-R'$$

wherein R is hydrogen or methyl, and R' is hydrogen, a linear or branched alkyl containing one to 10 carbon atoms, $CH_2-CH_2-OH$, $CH_2-CH(CH_3)-OH$, $CH_2-CH_2-CH_2-CH_2-OH$; $CH_2-CH_2-O-[C(O)-(CR''R''')_n-O]_mH$ wherein R'' and R''' are hydrogen or alkyl containing from one to three carbon atoms and n is from 3 to 8; $R_{10}-O-C(O)-C(R)=CH_2$ wherein $R_{10}$ is linear or branched alkyl containing from 2 to 12 carbon atoms; or $CH_2-CH_2-O-CH_2-CH_2$;

or a trimethylolpropane mono-, di-, or triacrylate; a pentaerythritol mono-, di-, tri-, and tetra-acrylate; alkoxylated derivatives of trimethylolpropane, or pentaerythritol acrylates; the reaction product of E-caprolactone with an hydroxylalkyl acrylate; an acrylated epoxide; or a urethane acrylate;

or combinations thereof, and wherein said polyol polymer is a polyester polyol, a polylactone polyol, a polyether polyol, a polyacrylate polyol, a polyvinyl polyol, or a polycarbonate polyol, or combinations thereof.

4. A laminate according to claim 3, wherein said radiation transmissible material has a transparency of at least about 80 percent, and wherein the amount of said one or more polyol polymers is from about 0.5 to about 65 parts by weight per 100 parts by weight of said cycloaliphatic epoxide.

5. A laminate according to claim 4, wherein said cycloaliphatic diepoxide comprises one or more of (a) 3,4-epoxycyclohexylmethyl-3,4-epoxycyclohexane carboxylates having the Formula I:

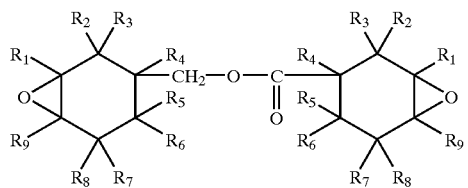

Formula I wherein $R_1$ through $R_9$ independently are hydrogen or linear or branched alkyl radicals containing from one to ten carbon atoms; (b) cycloaliphatic diepoxide esters of dicarboxylic acids having the Formula II:

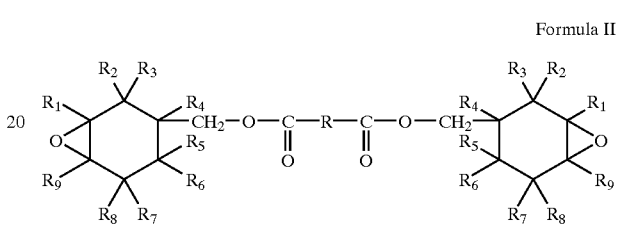

Formula II wherein $R_1$ through $R_9$ are the same as for said Formula I, and R is a valence bond or a linear or branched divalent hydrocarbon radical containing from 1 to 10 carbon atoms; or (c) limonene diepoxide.

6. A laminate according to claim 5, wherein said solid, non-crystalline, radiation-transmissible material comprises one or more of said borosilicate, said amorphous silica, or said fused silica, and wherein said acrylate is one or more of said 6-caprolactone reaction product with hydroxylalkyl acrylate wherein the alkyl group has 2 to about 4 carbon atoms; said alkoxylated trimethylolpropane acrylate wherein the alkoxy group has 2 to about 4 or more carbon atoms; said acrylated epoxide; or said urethane acrylate.

7. A laminate according to claim 6, wherein said epoxide is one or more of 3,4-epoxycyclohexylmethyl-3,4-epoxycyclohexane carboxylate, or Formula II wherein R1 through R9 is hydrogen and where R is an alkylene containing from 4 to 6 carbon atoms, or limonene diepoxide; wherein the amount of said polyol is from about 3 to about 50 parts by weight per 100 parts by weight of said cycloaliphatic diepoxide, and wherein said acrylated epoxides have the formula

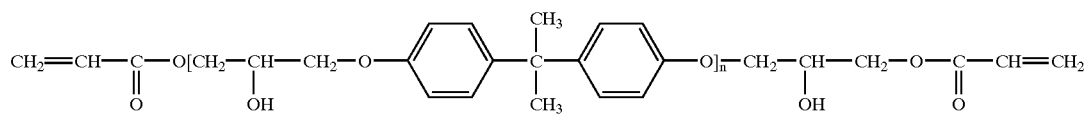

wherein n is from about 1 to about 30 or more; and said urethane acrylates have the formula 8. A laminate according to claim 7, wherein said solid, non-crystalline radiation-transmissible material has a refractive index of from about 1.42 to about 1.6, wherein said radiation-transmissible material has a mean particle diameter of from about 0.2 to about 1,000 microns, wherein said radiation-transmissible material has a transparency of at least about 90 percent, and wherein said polyol polymers include a polycaprolactone polyol, a poly(propylene oxide) polyol, a poly(ethylene oxide) polyol, a poly(tetramethylene oxide) polyol, or an ethylene oxide-capped poly(propylene oxide) polyol, or combinations thereof.

9. A laminate according to claim 8, wherein said cation-generating photoinitiator comprises one or more of aryl sulfonium complex salts of Group II, V, or VI elements, aromatic sulfonium or iodonium salts of halogen-containing complex ions of Group II, V or VI elements, or aromatic onium salts of Group II, V, or VI elements.

10. A laminate according to claim 9, wherein said aryl sulfonium complex salt comprises one or more of aryl sulfonium hexafluorophosphate or aryl sulfonium hexafluoroantimonate, and said aromatic iodonium salt comprises aryliodonium hexafluoroantimonate, and wherein said free-radical-generating photoinitiator comprises one or more of benzophenone, 2,2-diethoxyacetophenone, oligo(2-hydroxy-2-methyl-1,4-(1-methylvinyl)phenyl)propanone, or 2-hydroxy-2-methyl-1-phenyl-1-propanone (monomeric), and optionally including a sensitizer.

11. A laminate according to claim 1, wherein said substrate is a metal, a paper, a plastic, a glass, a ceramic, a wood, an adhesive, a sealant, or a composite material, or combinations thereof.

12. A laminate according to claim 2, wherein said substrate is a metal, a paper, a plastic, a glass, a ceramic, a wood, an adhesive, a sealant, or a composite material, or combinations thereof.

13. A laminate according to claim 4, wherein said substrate is a metal, a paper, a plastic, a glass, a ceramic, a wood, an adhesive, a sealant, or a composite material, or combinations thereof.

14. A laminate according to claim 5, wherein said substrate is a metal, a paper, a plastic, a glass, a ceramic, a wood, an adhesive, a sealant, or a composite material, or combinations thereof.

15. A laminate according to claim 6, wherein said substrate is a metal, a paper, a plastic, a glass, a ceramic, a wood, an adhesive, a sealant, or a composite material, or combinations thereof.

16. A laminate according to claim 7, wherein said substrate is a metal, a paper, a plastic, a glass, a ceramic, a wood, an adhesive, a sealant, or a composite material, or combinations thereof.

17. A laminate according to claim 8, wherein said substrate is a metal, a paper, a plastic, a glass, a ceramic, a wood, an adhesive, a sealant, or a composite material, or combinations thereof.

18. A laminate according to claim 9, wherein said substrate is a metal, a paper, a plastic, a glass, a ceramic, a wood, an adhesive, a sealant, or a composite material, or combinations thereof.

19. A laminate according to claim 10, wherein said substrate is a metal, a paper, a plastic, a glass, a ceramic, a wood, an adhesive, a sealant, or a composite material, or combinations thereof.

* * * * *